(12) United States Patent
Hagerman et al.

(10) Patent No.: US 6,530,072 B1
(45) Date of Patent: Mar. 4, 2003

(54) RULE BASED HIERARCHY GENERATION IN A CIRCUIT DESIGN VERIFICATION SYSTEM

(75) Inventors: John W. Hagerman, Boxford, MA (US); Matthew J. Bellantoni, Belmont, MA (US); Richard J. Cloutier, Andover, MA (US)

(73) Assignee: Chrysalis Symbolic Design, Inc., North Billerica, MA (US)

( * ) Notice: Subject to any disclaimer, the term of this patent is extended or adjusted under 35 U.S.C. 154(b) by 0 days.

(21) Appl. No.: 09/309,150

(22) Filed: May 10, 1999

Related U.S. Application Data (60) Provisional application No. 60/085,041, filed on May 11, 1998.

(51) Int. Cl.$^7$ .............................................. G06F 17/50
(52) U.S. Cl. ...................................................... 716/18
(58) Field of Search ................ 716/2, 10, 12, 716/18

(56) References Cited

U.S. PATENT DOCUMENTS 5,801,958 A  * 9/1998 Dangelo et al. ............... 716/18
6,421,818 B1  * 7/2002 Dupenloup et al. ........... 716/18

OTHER PUBLICATIONS

Vamsi Krishna, et als., A Tree–Matching Chip, IEEE Transactions on Very Large Scale Integration (VLSI) Systems, vol. 7, No. 2, Jun. 1999.

* cited by examiner

*Primary Examiner*—Matthew Smith
*Assistant Examiner*—Thuan Do
(74) *Attorney, Agent, or Firm*—Hamilton, Brook, Smith & Reynolds, P.C.

(57) ABSTRACT

A hierarchical structure for a non-hierarchical, non-ordered second representation of a circuit design is generated from a first hierarchical representation and a set of generation rules. Subsequently, the newly generated hierarchical structure is populated by design components to provide a second hierarchical representation. This second hierarchical representation enables comparison between the reference hierarchical structure and the new hierarchy representation to determine equivalence of the circuit designs associated with the new generated and reference hierarchical structure.

22 Claims, 9 Drawing Sheets

| | | |
|---|---|---|
| top (instance) | top.q1 (instance) | top.q2 (instance) |
| top.d (object) | top.q1.c (object) | top.q2.c (object) |
| top.e (object) | | |
| top.f (object) | top.q1.p1 (instance) | top.q2.p1 (instance) |
| | top.q1.p1.a (object) | top.q2.p1.a (object) |
| | top.q1.p1.b (object) | top.q2.p1.b (object) |
| | top.q1.p2 (instance) | top.q2.p2 (instance) |
| | top.q1.p2.a (object) | top.q2.p2.a (object) |
| | top.q1.p2.b (object) | top.q2.p2.b (object) |

RULE BASED HIERARCHY GENERATION IN A CIRCUIT DESIGN VERIFICATION SYSTEM

RELATED APPLICATION(S)

This application claims priority to U.S. Provisional Application No. 60/085,041 filed May 11, 1998, and the U.S. Ser. No. 09/054,673 filed Apr. 3, 1998 the entire teachings of both of which are incorporated herein by reference.

BACKGROUND OF THE INVENTION

The process of creating very-large-scale integrated (VLSI) circuit designs typically includes a structured sequence of steps. In an initial step, a VLSI circuit designer creates a computerized representation of a VLSI circuit design using a computerized tool. In the ensuing steps, the designer generates a series of subsequent representations using specialized tools including synthesis tools, optimization tools, and place-and-route tools. The designer might also generate a new representation manually using a computerized editing tool.

In general, each representation in the series describes the design at a different level of abstraction. It is common for the initial representation to describe the design at a high level of abstraction, and for each subsequent representation to describe the design at a respective lower level of abstraction. For example, the initial representation may describe the design at the register-transfer level (RTL), a subsequent representation may describe the design at the gate-level, and a subsequent representation from that may describe the design at the transistor-level. The process culminates with the generation of a database containing geometric detail of masks that will be used to fabricate the design.

A circuit design representation describes a design as a set of basic components that are connected together. Due to the size and complexity of VLSI circuit designs, it is a common practice for the designer to group components together in subsets called module definitions (or modules). A module defines an arrangement of components and other modules, and can be instantiated more than once in a representation. That is, the designer creates a module once to define an arrangement of elements, and uses instances of that module to represent specific portions of the design. Many hardware description languages (HDLs) support this hierarchical manner of design description. Designs are written as a set of module definitions. Computerized tools that read such designs can construct the full hierarchical representation of the design from the module definitions. In the full hierarchical representation, each element of the design has a unique representation.

To insure that no unintended changes are introduced into a newly generated representation, particularly when manual modifications have been made, the designer applies a computerized verification tool to the newly generated representation and a predecessor. The verification tool verifies that particular design aspects such as functional behaviors are preserved from representation to representation. This verifying process commonly is referred to as "design verification." An example of such a tool is Design VERIFYer (TM), which is marketed by Chrysalis Symbolic Design, Inc. of Billerica, Mass. Design VERIFYer verifies behavior preservation between first and second representations of a circuit design by finding matches between logic signals represented by the representations, and by comparing the logic functions driving the signals.

The signals of each representation are identifiable by signal name. If two representations are at the same level of abstraction (e.g., before and after optimization at the gate level) the signal names typically are kept the same. Design VERIFYer has a "name based" mode that finds matches between signals of different representations by matching signal names.

If two representations are at different levels of abstraction (e.g., before and after RTL-to-gate synthesis) the signal names typically are changed in some uniform manner. A designer may use a signal name mapping tool that performs "rule-based signal matching" prior to running the design verification tool to account for such changes. The signal name matching tool refers to each signal in one representation by signal name, i.e., by a character string. The character string is a series of subnames separated by a delimiter "." for example. The last subname in the series uniquely identifies a signal within a particular hierarchical element of the representation. The portion of the series up to but not including the last subname uniquely identifies the hierarchical element within the representation that contains the signal.

Hierarchy information and signal information are blended into one by flattening the hierarchy and maintaining the information implicitly as path prefixes in signal names. Then both kinds of mapping can be performed by considering only signal names.

Hierarchy can be understood as an organization or ordering of signals. As long as one can find the proper hierarchical organization of signals in both design representations and find at least part of the true relationship between the two hierarchies, one can use the information to improve verification performance. A hierarchical representation is a complete description of the design and manages the complexity of the design. A hierarchical description of a design consists of a set of modules, one of which is designated as the top module. Modules contain two kinds of elements: objects and instances. An object is a basic component of a design domain (for example, a signal in an electronic design). An instance is a use of a module. Instances thus define how modules are related. For example, consider the following two modules. Module P contains two objects (signal a and signal b), and module Q ontains one object (signal c) and two instances of module P (p1 and p2).

module P
      signal a;
      signal b;
   end module.
   module Q
      signal c;
      instance p1 of P;
      instance p2 of P;
   end module.

Each element in a hierarchical description has a unique path name. This name is constructed as a concatenation of the instance names along the path from the root to the element plus the name of the element itself, with some delimiter (for example, the period character) between each name. For example, if module Q is the "top" module then the following elements can be identified by name:

top (instance of Q)
   top.c (signal)
   top.p1 (instance)
   top.p1.a (signal)
   top.p1.b (signal)
   top.p2 (instance)

top.p2.a (signal)

top.p2.b (signal)

As discussed in U.S. provisional application Serial No. 60/085,041, different expressions of hierarchy result over the evolution of a design. Early in the design history there will be explicit hierarchy in the design representation, expressed using design language constructs. Later in the history after the design representation is flattened or made non-hierarchical, there will be implicit hierarchy encoded in the signal names. Still later, explicit hierarchy might be added to a flat design representation via grouping.

It is useful to map hierarchies for purposes of comparing design representations. By way of an example, by default, Design VERIFYer maps instances with the same names. This is done using the following default rule:

map_hierarchy_rule A . . . %s B . . . %1s;

For each pair of instances that match a rule, a Map_Hierarchy is created to map the instances together. Hierarchy mapping is done in a top-down fashion. That is, when an instance is considered, all of the instances in the path to that instance will already have been considered. This is important so that ' . . . ' ("match at each level of hierarchy") will work properly.

For example, suppose the design representations contained the following instances:

A.ctrl B.ctrl

A.ctrl.counter B.ctrl.counter

A.ctrl.decoder B.ctrl.decoder

The rule above works as follows.

Roots A and B are mapped;

Adhering to top-down ordering, the instance A.ctrl will be considered first. This instance will be matched by A . . . %s: the A . . . matches the path A and the %s matches the string "ctrl". Given this match, the instance B.ctrl will be matched by B . . . .%1s. The B . . . means "match the equivalent path as was matched in the A design," i.e., B and the %1s means "match the same string as was matched by the first %s", i.e., the string "ctrl". Since a pair of instances has been found, a mapping is created:

map_hierarchy A.ctrl B.ctrl;

Now that A.ctrl has been considered, the instances below it can be considered, so A.ctrl.counter is considered next. This instance will be matched by A . . . %s: the A . . . matches the path A.ctrl and the %s matches the string "counter". Given this match, the instance B.ctrl.counter will be matched by B . . . %1s. The B . . . means "match the equivalent path as was matched in the A design," i.e., B.ctrl (note that the mapping of A.ctrl and B.ctrl had to happen first for this to work), and the %1s matches "counter", producing:

map_hierarchy A.ctrl.counter B.ctrl.counter;

This process continues, mapping all of the instances in the two hierarchies.

If instance names are not the same in the two design representations but they are related in a systematic way, then rules can be used to map the hierarchies. For example, the suffix"_inst" might be added to all instances in the second or subsequent design representation:

A.ctrl B.ctrl_inst

A.ctrl.counter B.ctrl_inst.counter_inst

A.ctrl.decoder B.ctrl_inst.decoder_inst

All these instances can be mapped using one rule:

map_hierarchy_rule A . . . %s B . . . %1s_inst;

For example, A . . . %s will match A.ctrl, B . . . %1s_inst will match B.ctrl_inst. and the instances will be mapped together. Then A . . . %s will match A.ctrl.counter, B . . . %1s_inst will match B.ctrl_inst.counter_inst (since A.ctrl and B.ctrl_inst have already been mapped), and those instances will be mapped together.

Continuing this example, suppose that the signal names have not changed. Then the following rules will map the hierarchies and all the signals:

map_hierarchy_rule A . . . %s B . . . %1s_inst;

map_signal rule A . . . %s B . . . %1s.

SUMMARY OF THE INVENTION

Hierarchy mapping can be used to simplify signal mapping rules and the design verification process. Applicants take advantage of the recognition that hierarchy information is similar to signal information as both are structural: both are identified by name, and both can be mapped to show how two design representations are related.

According to the present invention, a hierarchical structure for a non-hierarchical, non-ordered representation of a circuit design having components defined by component names including hierarchial path information, is generated from a reference hierarchical structure and a set of rules. Subsequently, the newly generated hierarchical structure is populated by the design components defined by component names and a set of delimiters to provide a hierarchy representation corresponding to the subject non-hierarchical representation. This hierarchy representation enables comparison between the reference hierarchical structure and the new hierarchy representation to determine equivalence of the circuit designs associated with the new generated and reference hierarchical structure.

In a preferred embodiment, the present invention includes a generation step wherein a hierarchy from a reference design hierarchy is read, and used to create a template hierarchy for a revised representation of the design, and a population step wherein the components defined by component or signal names of the revised design representation are placed in the generated hierarchy for the revised design representation. The generation step of the present invention produces a mapping of the hierarchical elements of the reference and generated hierarchies. This mapping may be used to determine the equivalence of the reference and revised designs representations.

Further, in a preferred embodiment the hierarchy generation technique is integrated in a design verification system. The design verification system includes memory that stores a main working program, a first hierarchy of elements as the first representation of the design, a second non-hierarchical representation of elements as the second representation of the design and a plurality of generation rules. As the processing circuitry executes the program, the processing circuitry performs the following operations: a read operation that reads the elements of the first hierarchical representation from the memory; a generate operation that generates a second template hierarchy for the second representation according to the elements of the first representation and a plurality of generation rules; a populate operation that completes the template hierarchy by placing elements or components defined by the non-hierarchical component names of the second representation in the template hierarchy, and a compare operation that compares the first representation with the second representation according to the first hierarchy and generated second template hierarchy. The result of a comparison between the first and second representations indicates whether the first representation matches with the second representation. The integration of the hierarchy generation technique in the design verification system enables operations such as the generate, populate and compare operations to be well adapted to each other.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention enables VLSI circuit designers to perform a design verification procedure on representations of a VLSI circuit design. In particular, the invention enables designers to determine whether certain design aspects such as functional behavior are preserved between a first representation and a second representation of the design. To this end, a computer process (a) generates a set of map entries from the representations and map entries previously stored in the computer's memory, and (b) stores the generated map entries in the memory. The computer compares the representations according to the map entries stored in the memory to determine whether the representations match.

Figure 1:
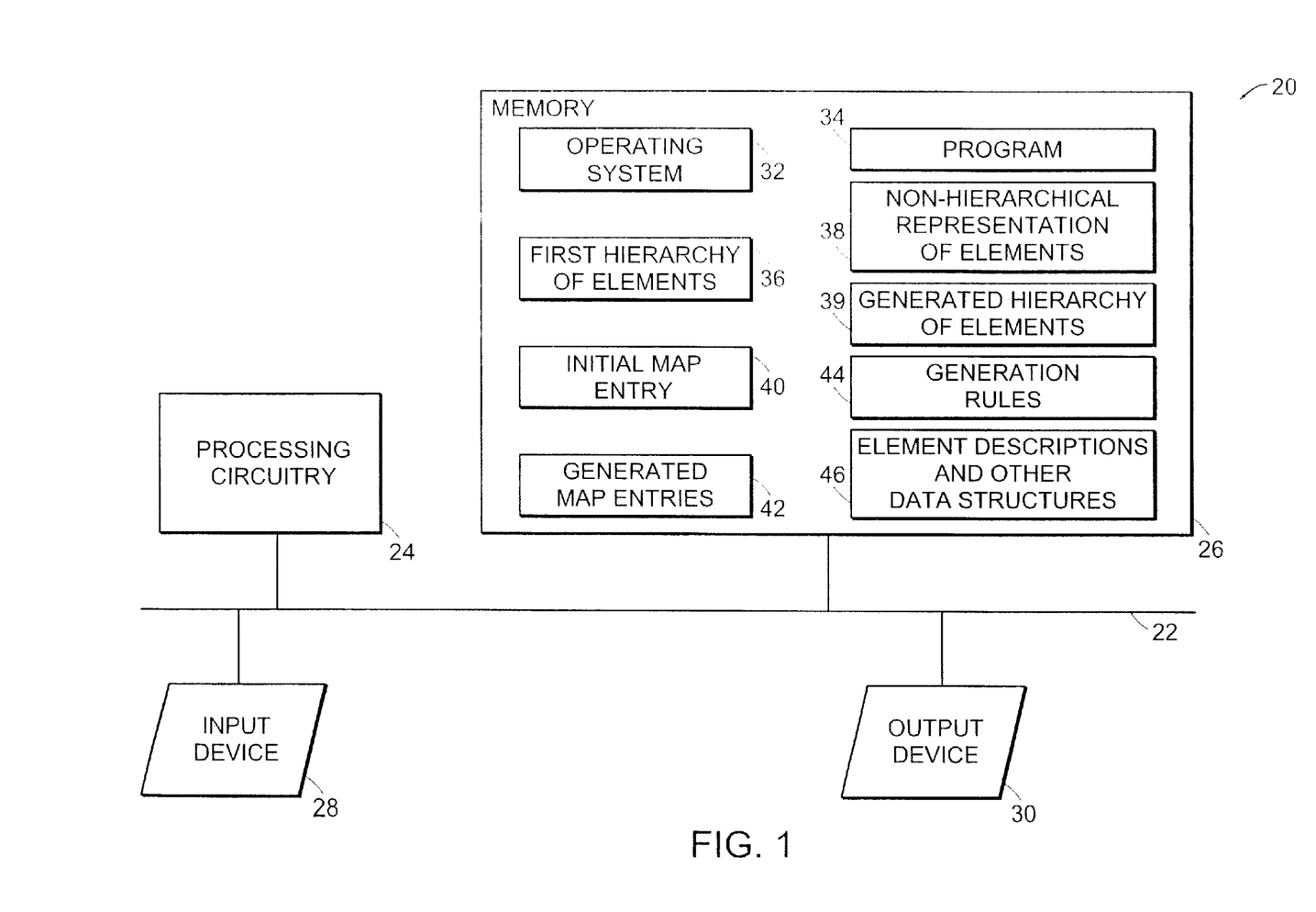
FIG. 1 is a block diagram of a general purpose computer that is suitable for use in accordance with the present invention.

A general purpose computer, such as that illustrated in FIG. 1, is suitable for the invention. The computer 20 includes a computer bus 22 and several connected working components including processing circuitry 24, memory 26, an input device 28, and an output device 30. The components communicate with each other by passing commands and data digitally through the bus 22. The memory 26 provides storage for the computer 20, and stores an operating system 32 and a design verification program 34. The processing circuitry 24 runs the operating system 32 and the program 34 by reading and executing instructions of the operating system 32 and the program 34. A user controls the operation of the computer 20 using the input 28 and output 30 devices. In particular, the user enters commands and data using the input device 28 to start, control and stop execution of the design verification program 34. Additionally, the user uses the output device 30 to receive feedback and other information such as a design verification result indicating whether the first representation matches with the second representation.

In addition to storing the operating system 32 and design verification program 34, the memory 26 of the computer stores a set of data structures including a first hierarchy of elements 36 that forms the first representation of the design, a second non hierarchical representation of elements 38 that forms the second representation of the design, a generated hierarchy of elements 39, and an initial map entry 40 that indicates a correspondence between an element of the first hierarchy and an element of the second generated hierarchy. The memory 26 further stores (i) map entries 42 that are generated by the processing circuitry executing program 34, (ii) generation rules 44, and (iii) other supporting structures 46 such as element descriptions that are used while the computer runs the design verification program 34.

It should be understood that the memory 26 generally refers to the storage used by the computer 20 including primary memory (e.g., volatile semiconductor memory that is accessed quickly such as cache memory and registers) and secondary memory (e.g., non-volatile memory that is accessed more slowly such as disks, tape, CD-ROM, and memory distributed over a network). It should be understood further that the computer 20 may include other components such as a network device and additional input/output devices. Other computer configurations are suitable and within the purview of one skilled in the art. The design representations that are compared by the invention program 34 may be at various levels of abstraction such as at the transistor-level, gate-level or register-transfer level. When a designer creates a new representation of a design from an old representation, the designer runs the program 34 on the computer 20 to verify that particular design aspects have been preserved in the new representation.

Figure 2:
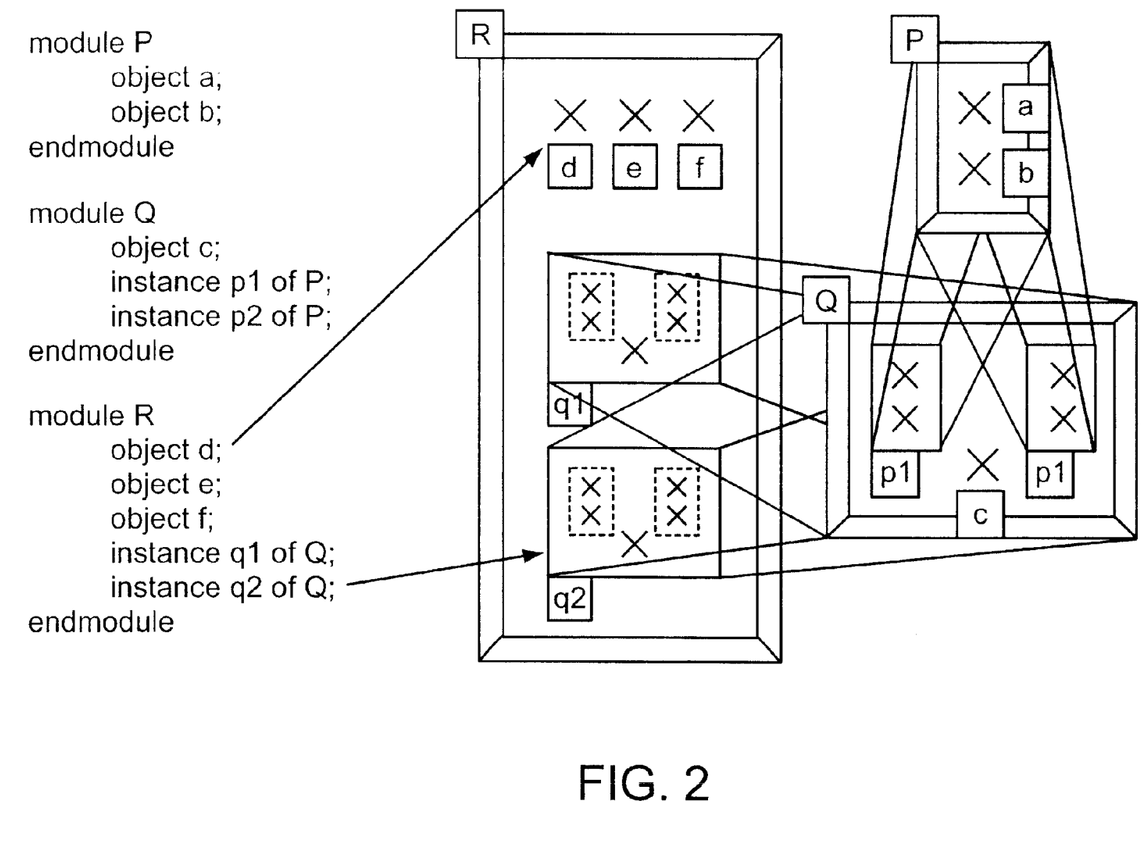
FIG. 2 is a diagram showing an exemplary hierarchical design and a corresponding text description.
Figure 3:
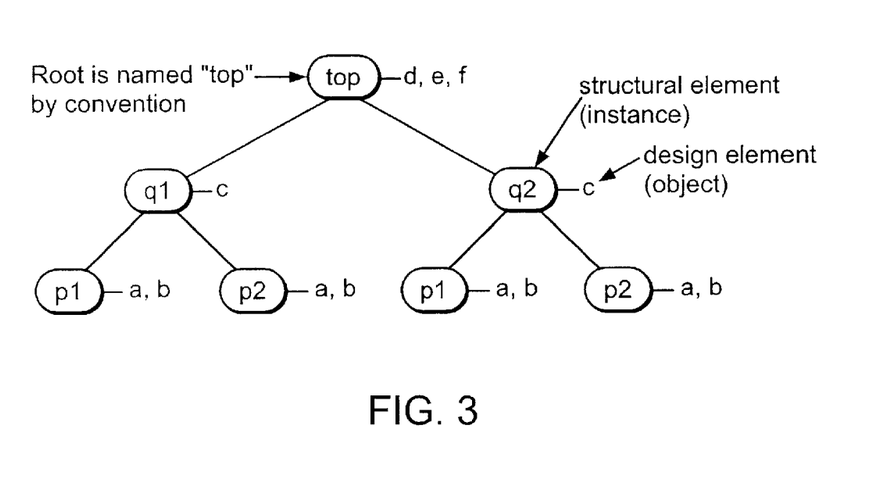
FIG. 3 is a diagram showing a fully expanded tree representation of the exemplary hierarchical design shown in FIG. 2.
Figure 4:
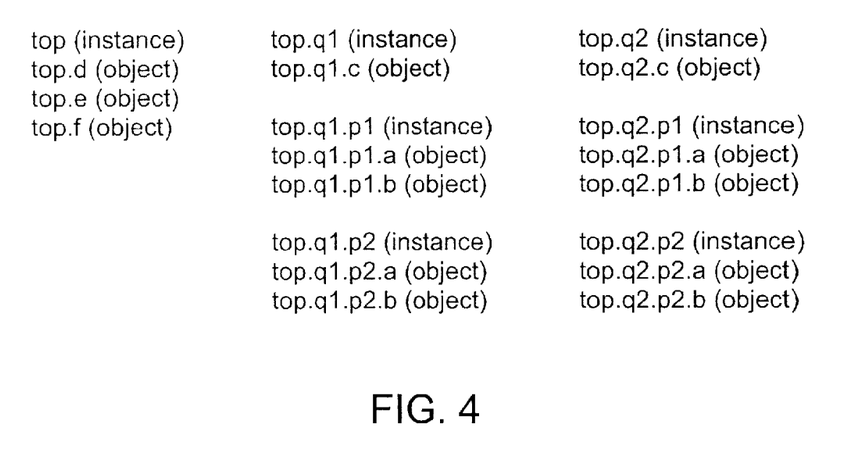
FIG. 4 is a list of the hierarchical elements of the exemplary hierarchical design shown in FIG. 2.

Referring to FIGS. 2–4, large circuit designs can be described hierarchically. Such descriptions consist of two kinds of elements: structural elements which define the hierarchy, and design elements which convey the design information (for example, signals in an electronic design). In particular, FIG. 2 illustrates a text description of a hierarchical design as described on the left hand side of the figure. The right hand side of the figure shows a pictorial representation of the hierarchical design. The three modules P,Q and R contain two kinds of elements: objects and instances. The instances are uses of the module. Thus, module P contains objects a and b, while Module Q contains object c and two instances p1 of P and p2 of P. The arrows show the correspondence of the elements in the text description and the pictorial representation, for example the location of object d and instance q2 of Q.

FIG. 3 illustrates a fully expanded tree representation of the hierarchical description of module R shown in FIG. 1. The tree representation includes different nodes that are coupled and organized in keeping with a hierarchical order. Each node is labeled with the name of an instance represented by the node. The first instance or root node is labeled as "top". The tree is drawn with the root at the top and child elements connected to the root. The tree representation is annotated with the objects of the hierarchical description. For example, the root "top" has three objects "d", "e", "f". Every object in the hierarchical description is uniquely represented.

FIG. 4 is a list of hierarchical elements of the exemplary hierarchical design shown in FIGS. 2 and 3. Each element has a unique path name. The name is constructed as a concatenation of the instance names along the path from the root plus the name of the element itself with a delimiter such as the period character. For example, the unique names for the instance elements "top", "top.d", "top.q1", "top.q1.p2" are as follows:

top (null path, element "top")
top.d (path "top", element "d")
top.q1 (path "top", element "q1")
top.q1.p2 (path "top.q1", element "p2")

Figure 5:
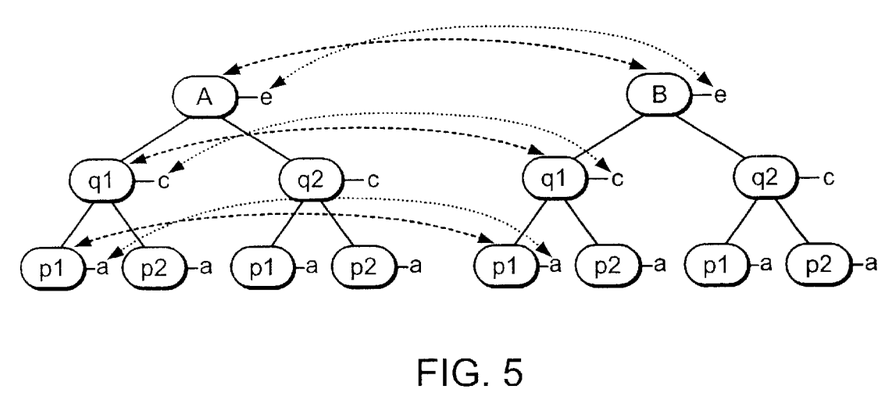
FIG. 5 is a schematic diagram showing a mapping of hierarchy elements in accordance with the present invention.

Two descriptions or representations of the same design are compared by finding the relationship between the two hierarchies, defined as a mapping of the hierarchy elements as shown in FIG. 5. The use of hierarchy structure simplifies the mapping of design objects. Hierarchy structure is used in two steps: first the structure elements (instances) are mapped, and second the design objects are mapped based on patterns in the object's names. When looking for a mapping for an object in instance i of the A design, the most likely place to find the corresponding object in the B design is in the instance to which i is mapped. Thus, root A is mapped to root B, and the elements "e" of the roots A and B are then mapped.

The use of hierarchy in a design description is artificial, that is, hierarchy is used for design convenience. The removal of hierarchy from a design description to produce a description consisting of a set of design objects with no hierarchial structure is called flattening. Flattening is required as this non-hierarchical representation of the design provides an explicit description to manufacture masks that will be used to fabricate the circuit design.

Figure 6:
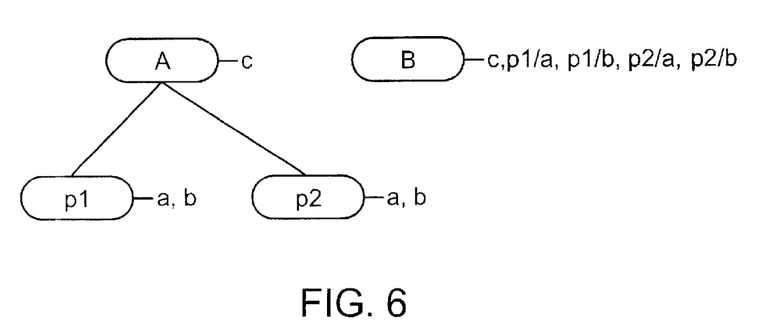
FIG. 6 is a schematic diagram showing an exemplary hierarchical and non-hierarchical design representation.

It is common practice in flattening to rename objects with their full path names. The period character can be used as a hierarchy delimiter, but a flattening tool may use some other delimiter as well. For example, referring to FIG. 6, consider the hierarchies from two versions of a design, the A hierarchy from a hierarchial version and the B hierarchy from a version after flattening with hierarchy delimiter '/'.

When comparing a hierarchial description of a design to a flat description of the same design, the comparison may be more easily made if a hierarchy is constructed for the flat description. The description itself does not need to be changed; the constructed hierarchy is for comparison purposes only. The object of the present invention is to construct such a hierarchy, to place the design objects from the flat description into the hierarchy, and then to perform the comparison between the hierarchy of the first (hierarchical) description and the constructed hierarchy of the second (flat) description.

The present invention includes a two part process for hierarchy construction. A first part uses a top-down pattern method to generate a hierarchy based on patterns in the names of instances in a given hierarchy. The second part involves the placement of design objects in a generated hierarchy and is referred to as populating the generated hierarchy.

Hierarchy generation is performed using string matching patterns or rules like those used for hierarchy mapping. A simple kind of generation is duplication. This is accomplished by using the following rule:

generate_hierarchy_rule A . . . %s B . . . %1s Rule 1

The following sequence of steps uses such rules to create a new B hierarchy from a give A hierarchy:

1. Create a root or parent instance for the B hierarchy and map the root instances of the two hierarchies (i.e., instances A and B) to each other.

2. Apply the instance generation patterns to A instances in top-down order. For each A instance that matches the first subrule, create a B instance with a name that will match the second subrule, and map the two instances to each other.

The following restrictions resolve potential ambiguities:

The rules are ordered, and if the first subrules of multiple instance generation rules match the same A instance then the mapping of the first rule in the order is taken. Any ordering may be chosen.

All match fields in the second subrule must be dynamic match fields. This causes every field in the second subrule to have one known value when an instance is created: literal fields always have known values, and dynamic match fields will have values determined by the matches of the corresponding match fields in the first subrule.

With these restrictions, a unique name is implied for each created B instance.

Using dynamic string matching rules to generate hierarchy is useful for dealing with instance name changes that occur before flattening. For example, referring to FIG. 7, consider the two hierarchies illustrated. If the second hierarchy is flattened with hierarchy delimiter '/', and the first design description is to be compared to the flattened description, then the simple duplication pattern (Rule 1) would not work, because it would produce a hierarchy in which full path names would not correspond to the names given to objects during flattening. Instead, the following rule is appropriate:

generate_hierarchy_rule A . . . %s B . . . %1s_inst Rule 2

When applied to the first hierarchy shown above, this sequence of steps progresses as follows:

1. Create B, and map (A,B).
2.
   a. Apply Rule 2 to first level A instances, create B.control_inst, and map (A.control, B.control_inst).
   b. Apply Rule 2 to second level A instances, create B.control_inst.state_inst, and map (A.control.state, B.control_inst.state_inst_) since (A.control, B.control_inst) is mapped, the ' . . .' match instance 'control' in the A hierarchy and instance 'control_inst' in the B hierarchy.

The second process part concerning populating the hierarchy in accordance with the present invention includes the use of the hierarchy information embedded in flattened object names to find the proper locations for objects in the generated hierarchy. Each object is placed in the generated hierarchy by parsing the object's full path name in the context of the generated hierarchy. Parsing requires that the hierarchy delimiter used in flattening be explicitly provided.

An exemplary parsing is accomplished by the following sequence of steps. The "current container instance" C is initially set to the root instance of the generated hierarchy. The "remaining path name" is initially set to that portion of the full path name beginning with the name of the first real instance. Then each instance below C is considered. A string is constructed by concatenating the name of the instance under consideration and the given hierarchy delimiter. The string is compared to the beginning of the remaining path name. The instance with the longest such string which successfully matches the beginning of the remaining path name is taken as the new C, and the beginning portion of the remaining path name which matched the string is removed from the remaining path name. This process is repeated until progress stops. C is taken as the proper location for the object being placed in the generated hierarchy.

The objects resulting from the flattening of the second hierarchy discussed hereinabove with hierarchy delimiter '_' and a following set of flattened signals names:

B.clock_obj
B.control_inst_detect_obj
B.control_inst_state_inst_latch_obj
B.control_inst_state_inst_inst_latch obj object clock_obj:
 set C to B, set remaining path name to "clock_obj";
 no instances in C produce a successful match, so stop and put the object in the generated instance B with name "clock_obj".

object control_inst_detect_obj:
 set C to B, set remaining path name to "control_inst_detect_obj";
 in C the generated instance control_inst concatenated with '_' produces a successful match to the beginning of "control_inst_detect_obj" so set C to control_inst and remove "control_inst_" from the remaining path name, leaving "detect_obj"; no instances in C produce a successful match, so stop and put the object in the generated instance control_inst with name "detect_obj".

object control_inst_state_inst_latch_obj:
 set C to B, set remaining path name to control_inst_state_inst_latch_obj";
 in C the generated instance control_inst concatenated with '_' produces a successful match to the beginning of "control_inst_state_inst_latch_obj" so set C to control_inst and remove "control_inst_" from the remaining path name, leaving "state_inst_latch_obj";
 in C the generated instance state_inst concatenated with '_' produces a successful match to the beginning of "state_inst_latch_obj" so set C to state_inst and remove "state_inst_" from the remaining path name, leaving "latch_obj";
 no instances in C produce a successful match, so stop and put the object in the generated instance state_inst with name "latch_obj".

object control_inst_state_inst_inst_latch_obj:
 set C to B, set remaining path name to "control_inst_state_inst_inst_latch_obj";
 in C the generated instance control_inst concatenated with '_' produces a successful match to the beginning of "control_inst_state_inst_inst_latch_obj" so set C to control_inst and remove "control_inst_" from the remaining path name, leaving "state_inst_inst_latch obj";
 in C both the generated instance state_inst concatenated with '_' and the generated instance state_inst_inst concatenated with '_' produce a successful match to the beginning of "state_inst_inst_latch_obj", and the longer match is preferred, so set C to state_inst_inst and remove "state_inst_inst" from the remaining path name, leaving "latch_obj";
 no instances in C produce a successful match, so stop and put the object in the generated instance state_inst_inst with name "latch_obj".

Figure 7:
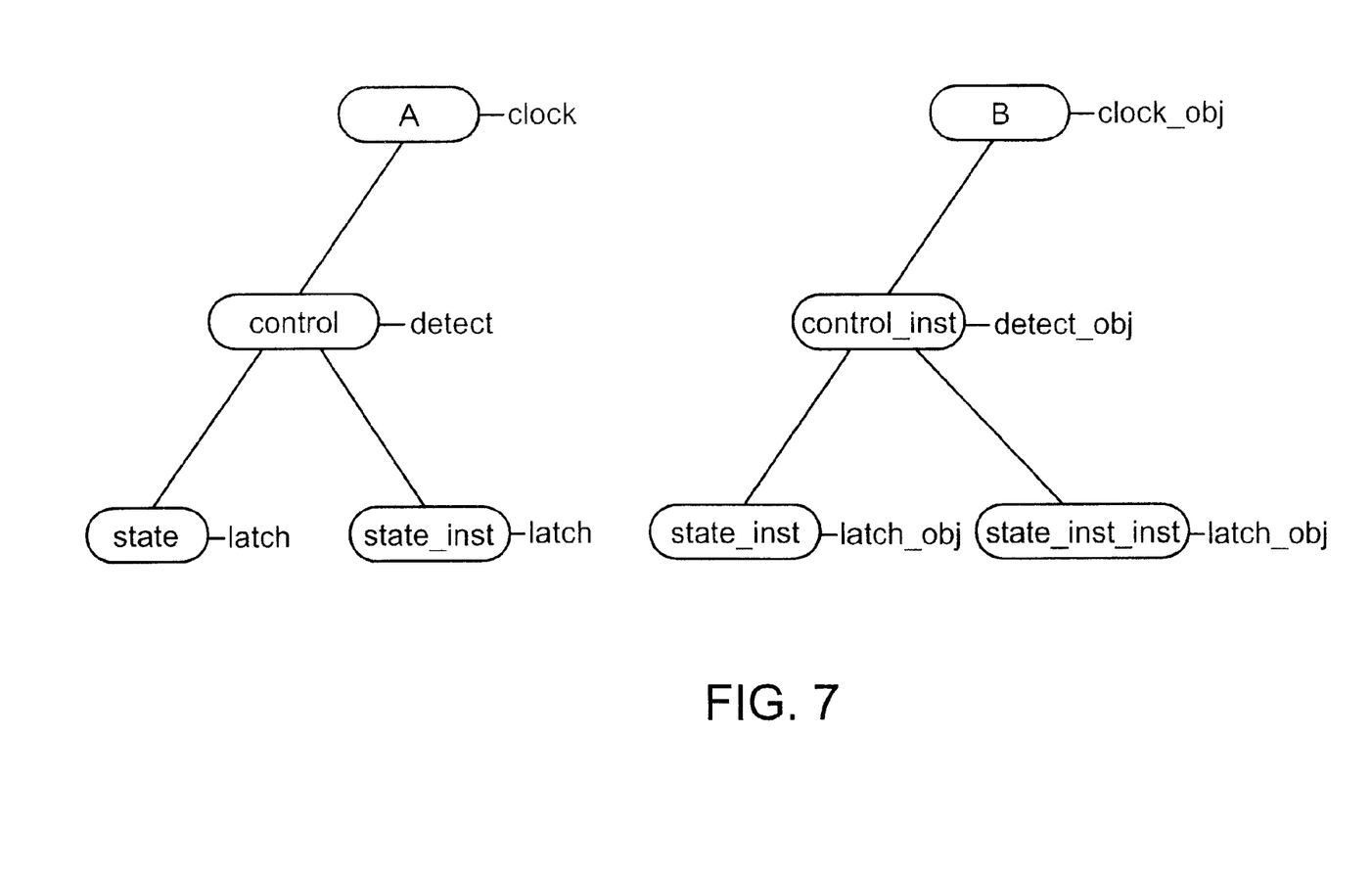
FIG. 7 is a schematic diagram showing two hierarchical design representations.

The final result in this example is a generated hierarchy with design objects located exactly as illustrated by the second hierarchy illustrated in FIG. 7.

Figure 8A:
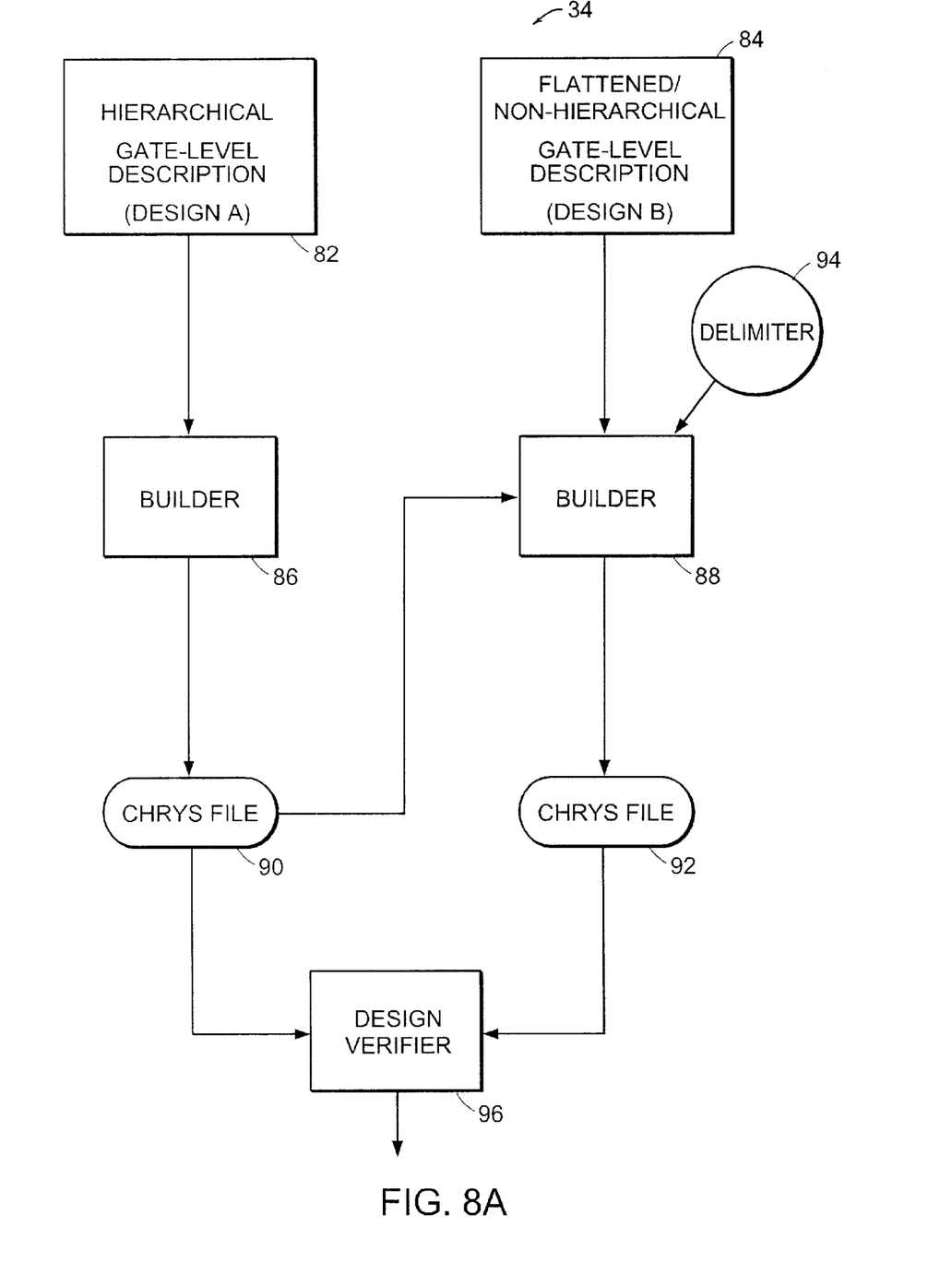
FIG. 8A is a block diagram showing an exemplary circuit verification system in accordance with the present invention.

Referring to FIG. 8A, a diagram of an exemplary circuit design verification system in accordance with the present invention is illustrated. Typically, a circuit designer works with a hierarchical gate-level description 82 which is a first design representation (design A) and a flattened gate-level description 84 which is a second design representation (design B). The designer then uses a design verification tool, for example, Design VERIFYer, which first executes a tool such as the build step, builder 86, 88 to produce a representation of the design logic. The output of the builder 86, 88 forms the input into a file, such as a Chrys file 90, 92 for example. The example of a hierarchy generation tool such as builder and the files such as Chrys are developed by Chrysalis Symbolic Design, Inc. for use in conjunction with Design VERIFYer. Builder 88 generates a template hierarchy file which is stored in the Chrys file 92, and Design VERIFYer 96 uses the hierarchy file information to verify behavior preservation.

Hierarchy information for a hierarchical representation of a design A is used from Chrys file 90 to build a hierarchical representation of design B in builder 88. The builder 88 extracts whatever hierarchy is present in the flattened design input files, for example in the flattened gate-level description 84, and generates a hierarchy using information from the reference design (design A), as long as the original hierarchy information remains encoded in the signal names in the non-hierarchical representation. A user input providing delimiter information also forms an input 94 into the builder 88. The delimiter information, be it for example "_" or "/", ensures that when the string name of the element or component is parsed, the hierarchical level is distinguished from the delimiter. Thus, the hierarchical representation of design B is generated and populated in builder 88 and the output of this process forms the input into Chrys file 92. Chrys file 92 contains the generated hierarchical representation of design B, logic information and hierarchical mapping information. A design verification tool, design verifier 96 is then executed which takes inputs from the two Chrys files 90, 92. The design verifier 96 first performs a mapping and then executes a proof portion to check for equivalency between the two design representations.

In an alternate embodiment of the present invention, the hierarchical generation may be performed at the design verifier level or at any other level other than the build level.

As discussed hereinbefore, the generation of the hierarchical representation B includes the creation of a template for the B design and subsequently placing the components of the B design, defined by component names, into the generated template hierarchy. The creation of the template hierarchy has to contend with changes such as name changes and structure changes in the hierarchical representation. These changes are dealt with so that these design aspects are preserved from the first design representation A to the second design representation B.

A template hierarchical structure is created whenever a rule such as generate_hierarchy_rule A . . . %s B . . . %1s_I applies to the name of an element of the A hierarchy. Therefore, a root element and child elements thereof are created and then mapped for subsequent verification purposes. When a generation rule matches the name of an element of the first hierarchy, a hierarchical structure corresponding to the element of the second representation is added in the template (B) hierarchy. Following the addition of the hierarchical structure to the template (B) hierarchy, the mapping of the template hierarchical structure with the corresponding element of the first (A) hierarchy is stored in a working memory. After creating the template (B) hierarchy, the template is populated using the components of design representation B defined by component names. At the end of the generation process a second (B) hierarchy results together with the element or component names positioned in the B hierarchy.

Figure 8B:
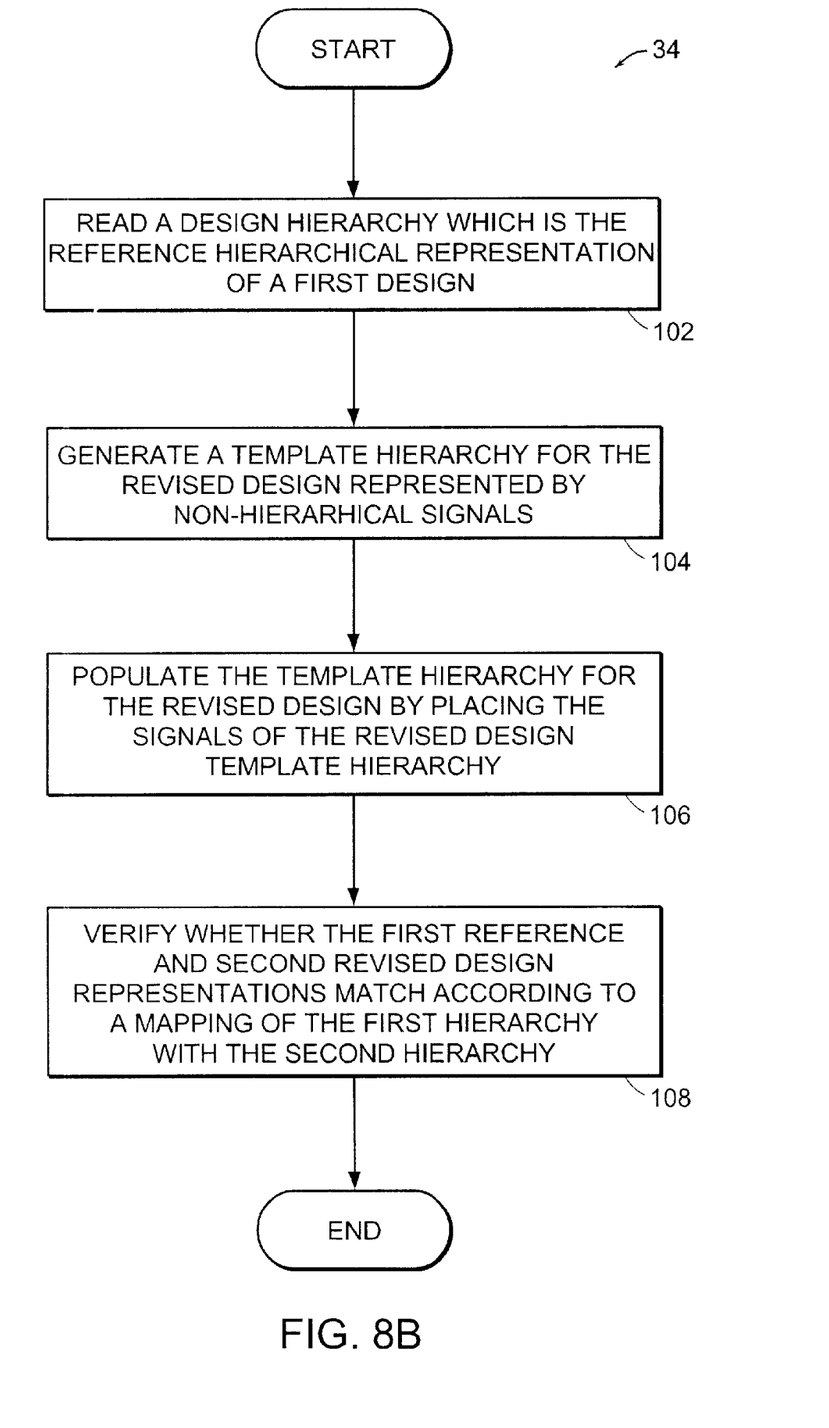
FIG. 8B is a flow chart of a design verification method in accordance with the present invention.

Referring to FIG. 8B, a flow chart of a design verification method such as one illustrated in FIG. 8A is illustrated. Beginning in step 102, the invention system reads a design hierarchy which is the hierarchical representation of a reference or first design from memory 26 (shown in FIG. 1). In step 104, the system generates a template hierarchy for the second representation of the design represented by non-hierarchical signals defined by signal or component names. A plurality of generation rules is used to generate the template hierarchy as described above for the example of FIG. 7. Specifically, the step 104 of generating the template hierarchy includes applying a first generation rule to the name of a first element of the reference or first hierarchy. When the first generation rule matches the name of the first element of the first hierarchy, a hierarchical structure corresponding to a first element of the revised or second representation is created and added to the template hierarchy. When the hierarchical structure is added to the template hierarchy, the mapping of the template hierarchical structure with the corresponding element of the first hierarchy is stored in memory. A second and subsequent other elements are similarly processed, until all the elements of the first hierarchy are processed.

In step 106, the system populates the template hierarchy by placing the signals or components defined by signal names of the second representation in the template hierarchy. This results in a working hierarchy corresponding to the second representation. In the preferred embodiment, the component names of the revised design include hierarchical path information. In step 108, the system compares the first and second hierarchies and the result of this comparison verifies if the first reference design matches the second revised design.

Figure 9A:
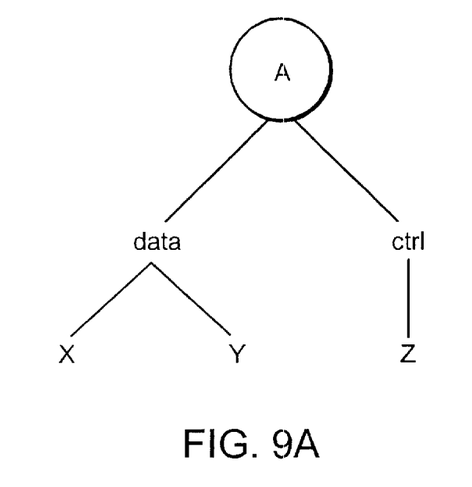
FIGS. 9A–9C are schematic diagrams illustrating the hierarchy generation in accordance with the present invention.

By way of another example, and referring to FIG. 9A, a hierarchical first representation of a design having a name "A" is illustrated. A flattened representation of a second design having the name "B" includes signals with the following names:

B.data_extra_X_I

B.data_extra_Y_I

B.ctrl_extra_Z_I

Figure 9B:
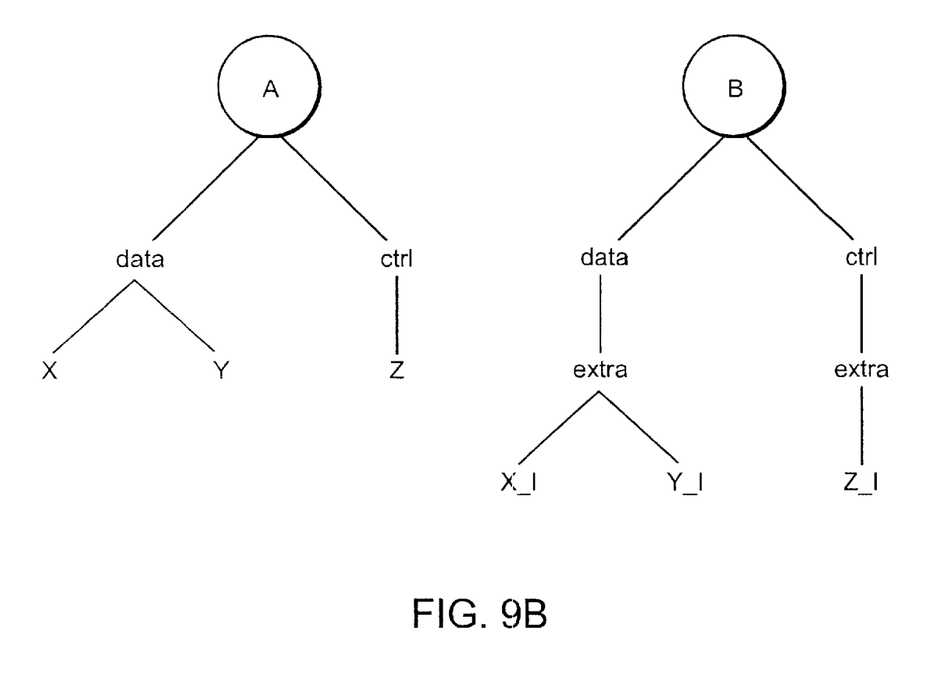

In accordance with the present invention a template hierarchy is created for the second representation as shown in FIG. 9B using the following generation rules:

generate_hierarchy_rule A.%s B.%1s.extra generate_hierarchy_rule A . . . %s B . . . %1s_I First a root "B" is first created. Each portion or subrule of the generation rule includes a literal field and a match field. In the first rule, the first subrule includes "A." as its literal field, and "%s" as its match field. Similarly, the second subrule includes "B." as its literal field and "%1s.extra" as its match field. The match fields of the first and second subrules are linked so that the same character string is matched by both fields. Thus, the first generation rule matches the name of the first element A.data of the first hierarchy to the first element B.data_extra of the second representation, and a hierarchical structure corresponding to B.data_extra of the second representation is created and added to the template hierarchy. In a like manner the first generation rule matches and maps A.ctrl to B.ctrl_extra.

Figure 9C:
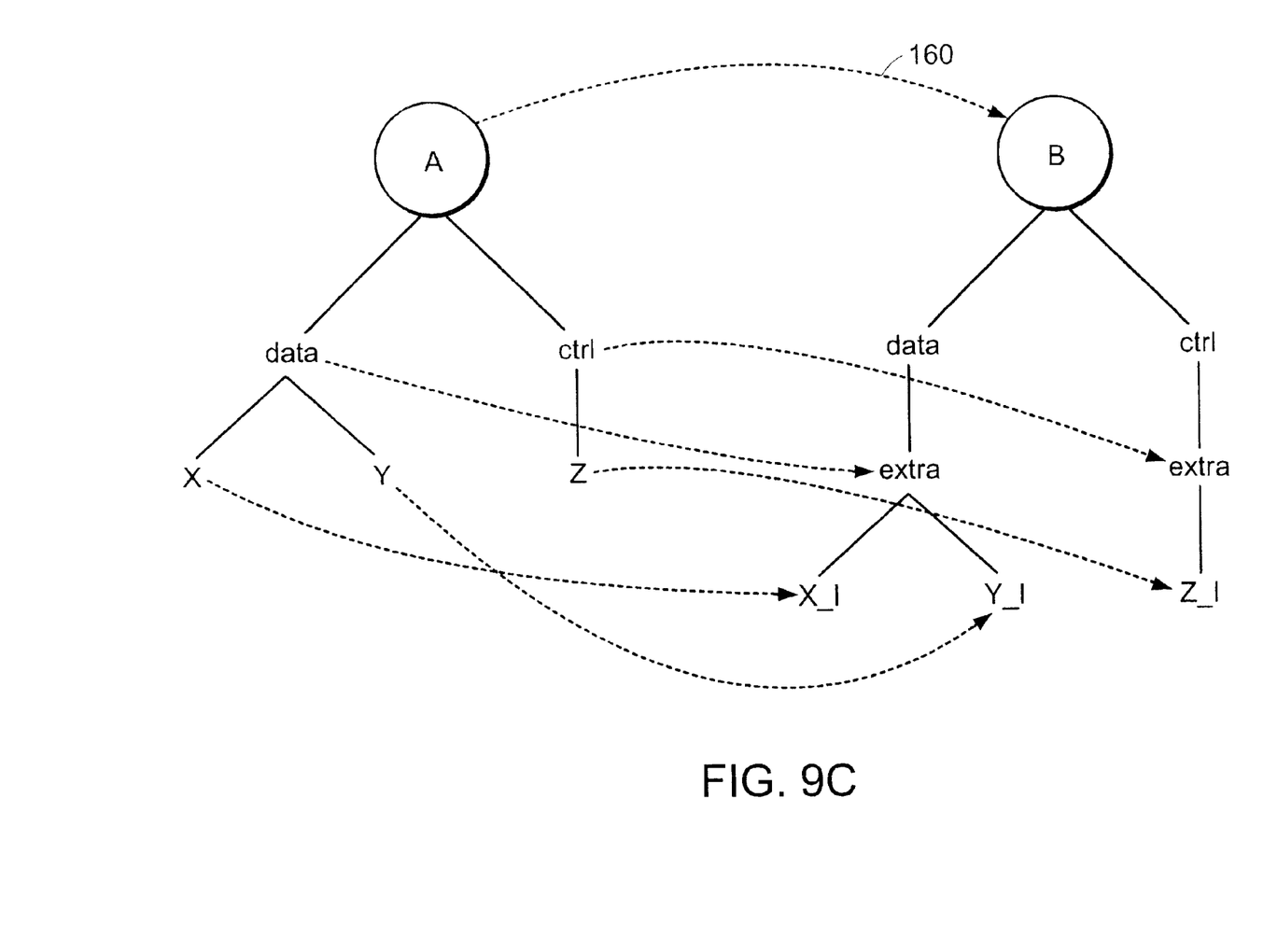

The mapping between one element of the first representation and a respective element of the second representation is stored in a memory as illustrated in FIG. 9C. For example, the dashed line 160 indicates the correspondence between the root elements A and B. Similarly, other dashed lines indicate the correspondence between the first element of the first representation and the first component of the second representation, the correspondence between respective second components, and so forth. This methodology is followed for the remaining elements in the first representation.

Referring back to the generation rules, the element A.data.x matches the second generation rule and a hierarchical structure corresponding to a matching element (B.data_extra_X_I) in the second representation is created and added to the template hierarchy. This is similarly carried out for matching and mapping A.data.Y to B.data_extra_Y_I and A.ctrl.Z to B.ctrl_extra_Z_I, i.e., until all the components of the second representation have a corresponding hierarchical structure in the template hierarchy.

The subsequent populating step which places the signal or component names of the second design representation into the created template hierarchy, parses the component names. A user input indicating the delimiter of use forms an important input into the populating step. For example, the hierarchical delimiter used in the designs illustrate in FIGS. 9A–9C is "_". The component names for the second design representation that are stored in memory are parsed to find out where in the generated template hierarchy the corresponding components need to be positioned in the template hierarchy. The first component name of the second representation is parsed by setting a portion of the component name to a root of the generated template hierarchy. The remaining portion of the component name is set to a path name beginning with the name of an instance of the signal and constructing a string by concatenating the name of the component and the hierarchy delimiter. The first component of the second representation is then placed in the template hierarchy. This methodology is repeated for each of the components of the second representation and results in a populated hierarchy.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

For example, the design verification system uses a previously stored hierarchy. This hierarchy may be provided manually by the user. Furthermore, it should be understood that the design verification system was described above using one ' . . . ' in each subrule for simplicity. The system may be modified to include more than one ' . . . ' in each subrule, and such a system is intended to be within the scope of the invention.

Additionally, the design verification system was described above as referencing elements by their character string names, each having a series of subnames separated by delimiters. Alternatively, the system may be modified to reference elements by their identifiers, or by the identifiers of their parents and the names of the elements within the parents, and such modifications are intended to be within the scope of the invention.

Furthermore, it should be understood that optimizations can be made to the system. For example, the system can be modified to detect specific types of mapping situations that do not require certain steps to be performed. In such cases, the non-required steps can be skipped. Accordingly, system resources such as processing cycles are saved.

It should be understood that the series of generation rules provides an order of priority in which to apply the rules. The user should select the order of the generation rules based on the user's desired generation of elements. In particular, the generation rules should be ordered such that an improper generation does not occur which will prevent a correct generation from occurring.

Although the system was described above such that each element of the first hierarchy corresponds to an element of the second hierarchy, the system may map an element of the first hierarchy with multiple generated elements in the second hierarchy. To this end, once an element has been processed through the steps in accordance with the present invention, the system continues to attempt to process it again. In particular, the system may generate other elements by using different generation rules.

Similarly, the system may map multiple elements in the first hierarchy with a single generated element in the second hierarchy. Here, the system does not ignore elements of the second hierarchy that have already been generated. Rather, if an existing element of the second hierarchy can be mapped with an element of the first hierarchy even though it has already been mapped at least once, the system maps that element another time.

Furthermore, it should be understood that a plurality of hierarchy delimiters may form a user input as opposed to only one hierarchy delimiter as described hereinabove. For example, multiple delimiters can form an input to the step of populating the template hierarchy 106 as shown in FIG. 8B. The method of parsing a component name is followed for all the hierarchy delimiters. Therefore, for each hierarchy delimiter, the pausing of a component name will include (a), identifying a portion of the name as a root of the template hierarchy, identifying a remaining portion of the name as the component name, (b) constructing a string by concatenating the name of a child element of the element and the hierarchy delimiter; and (c) if the string matches the beginning of the remaining component name, identifying the element as the child element, and identifying the remaining component name as the portion of the remaining component name that is not matched.

It should be understood that a step that is not necessarily dependent on the completion of an earlier described step does not need to wait for the completion before starting. For example, portions of steps 106 and 108 (FIG. 8B) may be performed simultaneously or in parallel. That is, after some map entries have been generated by the system, the system may begin comparing portions of the hierarchies based on those map entries even if all of the map entries have not yet been generated.

Furthermore, the invention may be applied to generating representations other than VLSI circuit design representations. For example, the method for verifying whether design representations match in accordance with the present invention may be used in other hierarchically arranged designs such as mechanical and architectural designs.

Additionally, the system was described as proceeding through hierarchy mappings in a top-down, depth-first manner. Alternatively, the system may attempt to map the elements in a top-down, breadth-first manner. That is, the system first attempts to map sibling elements, and then subsequently maps children elements of the siblings.

It should be understood that, when the design verification system matches a first hierarchy with a second hierarchy, the first hierarchy can be an original representation, and the second hierarchy can be a representation derived from the original representation. Alternatively, the second hierarchy can be an original representation, and the first hierarchy can be a representation derived from the original representation. As another alternative, each of the first and second hierarchies can be an original representation of different designs that are being compared for equivalency.

Furthermore, it should be understood that the pattern syntax and semantics used in the mapping rules described above were provided by way of example only. Alternative pattern syntax and semantics can be used.

What is claimed is:

1. In a digital processing system having a memory that stores (i) a first hierarchy of elements, the first hierarchy being a first representation of a circuit design, and (ii) a second representation of the circuit design having components defined by component names including hierarchical path information, a method for verifying whether the first representation matches the second representation, the method comprising the steps of:

reading the first hierarchy of elements;

generating a template hierarchy for the second representation;

populating the template hierarchy for the second representation by placing the components defined by component names of the second representation in the template hierarchy, resulting in a working hierarchy corresponding to the second representation; and comparing the first representation with the second representation according to a mapping of the first hierarchy and the working hierarchy to determine equivalence between the first representation and the second representation.

2. The method of claim 1, wherein the step of generating a template hierarchy further comprises the step of creating a hierarchical structure based on the first hierarchy and a plurality of generation rules.

3. The method of claim 2, wherein the step of creating a hierarchical structure includes the steps of:

applying a first generation rule to the name of a first element of the first hierarchy;

when the first generation rule matches the name of the first element of the first hierarchy, creating a hierarchical structure corresponding to a first element of the second representation in the template hierarchy, and adding the created hierarchical structure to the template hierarchy; and when the hierarchical structure is added to the template hierarchy, storing in a working memory the mapping of the template hierarchical structure with the corresponding element of the first hierarchy.

4. The method of claim 3, wherein the step of creating a hierarchical structure further includes the step of:

when one of the step of applying a first generation rule and the step of matching is unsuccessful, applying another generation rule to the name of the first element of the first hierarchy.

5. The method of claim 2, wherein the memory further stores the plurality of generation rules, and wherein the step of generating a template hierarchy further includes the steps of:

(a) creating a hierarchical structure according to one of the plurality of generation rules and a description of a first element of the first hierarchy;

(b) searching for a first element of the second representation that fits the element description of the first element of the first representation;

(c) using the created hierarchical structure, generating a template hierarchical structure in the template hierarchy and a map entry identifying a correspondence between respective first elements of the first and second representations; and repeating steps (a) through (c) with another element of the first hierarchy, and ending the step of repeating when the steps (a) through (c) have been performed for each element of the second representation.

6. The method of claim 2, wherein the steps of generating and populating a template hierarchy includes the steps of:

mapping a parent element of the first hierarchy with an element of the second hierarchy; and subsequently mapping a child element of the first hierarchy with another element of the second hierarchy, the child element being a child of the parent element.

7. The method of claim 1, wherein the step of populating the template hierarchy includes the step of reading in and applying a set of delimiters.

8. The method of claim 1, wherein the step of populating includes the step of parsing each string of component names of the second representation.

9. The method of claim 1, wherein the step of populating the template hierarchy includes the steps of:

(a) reading in a hierarchy delimiter;

(b) parsing a first component name of the second representation by identifying a path portion of the first component name of the second representation, and identifying a non-path portion of the name;

(c) placing the first component of the second representation in a proper location in the template hierarchy according to step (b); and (d) repeating steps (b) and (c) by using another component name of the second representation, and ending the step of repeating when the steps (b) and (c) have been performed for each element of the second representation.

10. The method of claim 9, wherein the step of parsing a component name includes the steps of:

(a) identifying a current element as a root of the template hierarchy, and identifying a remaining component name as the component name;

(b) constructing a string by concatenating the name of a child element of the current element and the hierarchy delimiter;

(c) when the string matches the beginning of the remaining component name, identifying the current element as the child element, and identifying the remaining component name as the portion of the remaining component name that is not matched;

(d) repeating steps (b) and (c) using another child element of the current element, and ending the step of repeating when the steps (b) and (c) have been performed for each child element of the current element without producing a match;

(e) recording the current element as the identified element of the template hierarchy, and recording the remaining component name as the non-path portion of the name.

11. The method of claim 9, wherein the step of populating the template hierarchy further includes the step of reading in a plurality of hierarchy delimiters.

12. A circuit design verification system for verifying whether a first representation of a circuit design matches with a second representation of the circuit design, the design verification system comprising:

a working memory that stores (i) a first hierarchy of elements as the first representation of the design, (ii) components defined by a nonhierarchical set of component names including hierarchical path information as the second representation of the design and (iii) a set of generation rules; and a processing assembly executable by a digital processor for:

reading the first hierarchy of elements;

generating a template hierarchy for the second representation;

populating the template hierarchy for the second representation by placing the components defined by component names of the second representation in the template hierarchy, resulting in a working hierarchy corresponding to the second representation; and comparing the first representation with the second representation according to a mapping of the first hierarchy and the working hierarchy to determine equivalence between the first representation and the second representation.

13. The circuit design verification system of claim 12, wherein the step of generating a template hierarchy further comprises the step of creating a hierarchical structure based on the first hierarchy and a plurality of generation rules.

14. The circuit design verification system of claim 13, wherein the step of creating a hierarchical structure includes the step of:

applying a first generation rule to the name of a first element of the first hierarchy;

when the first generation rule matches the name of the first element of the first hierarchy, creating a hierarchical structure corresponding to a first element of the second representation in the template hierarchy, and adding the created hierarchical structure to the template hierarchy; and when the hierarchical structure is added to the template hierarchy, storing in a working memory the mapping of the template hierarchical structure with the corresponding element of the first hierarchy.

15. The circuit design verification system of claim 14, wherein the step of creating a hierarchical structure further includes the step of:

when one of the step of applying a first generation rule and the step of matching is unsuccessful, applying another generation rule to the name of the first element of the first hierarchy.

16. The circuit design verification system of claim 13, wherein the memory further stores the plurality of generation rules, and wherein the step of generating a template hierarchy further includes the steps of:

(a) creating a hierarchical structure according to one of the plurality of generation rules and a description of a first element of the first hierarchy;

(b) searching for a first element of the second representation that fits the element description of the first element of the first representation;

(c) using the created hierarchical structure, generating a template hierarchical structure in the template hierarchy and a map entry identifying a correspondence between respective first elements of the first and second representations; and repeating steps (a) through (c) with another element of the first hierarchy, and ending the step of repeating when the steps (a) through (c) have been performed for each element of the second representation.

17. The circuit design verification system of claim 13, wherein the steps of generating and populating a template hierarchy includes the steps of:

mapping a parent element of the first hierarchy with an element of the second hierarchy; and subsequently mapping a child element of the first hierarchy with another element of the second hierarchy, the child element being a child of the parent element.

18. The circuit design verification system of claim 12, wherein the step of populating the template hierarchy includes the step of reading in and applying a set of delimiters.

19. The circuit design verification system of claim 12, wherein the step of populating includes the step of parsing each string of flattened component name of the second representation.

20. The circuit design verification system of claim 12, wherein the step of populating the template hierarchy includes the steps of:

(a) reading in a hierarchy delimiter;

(b) parsing a first component name of the second representation by identifying a path portion of the first component name of the second representation and identifying a non-path portion of the name;

(c) placing the first component of the second representation in a proper location in the template hierarchy according to step (b); and (d) repeating steps (b) and (c) by using another component name of the second representation, and ending the step of repeating when the steps (b) and (c) have been performed for each element of the second representation.

21. The method of claim 20, wherein the step of parsing a component name includes the steps of:

(a) identifying a current element as a root of the template hierarchy, and identifying a remaining component name as the component name;

(b) constructing a string by concatenating the name of a child element of the current element and the hierarchy delimiter;

(c) when the string matches the beginning of the remaining component name, identifying the current element as the child element, and identifying the remaining component name as the portion of the remaining component name that is not matched;

(d) repeating steps (b) and (c) using another child element of the current element, and ending the step of repeating when the steps (b) and (c) have been performed for each child element of the current element without producing a match;

(e) recording the current element as the identified element of the template hierarchy, and recording the remaining component name as the non-path portion of the name.

22. The method of claim 20, wherein the step of populating the template hierarchy further includes the step of reading in a plurality of hierarchy delimiters.

* * * * *